United States Patent
Sakaida et al.

(10) Patent No.: US 9,133,366 B2
(45) Date of Patent: Sep. 15, 2015

(54) POLISHING LIQUID COMPOSITION FOR WAFERS

(71) Applicant: NISSAN CHEMICAL INDUSTRIES, LTD., Tokyo (JP)

(72) Inventors: Hiroaki Sakaida, Sodegaura (JP); Eiichirou Ishimizu, Sodegaura (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/402,184

(22) PCT Filed: May 21, 2013

(86) PCT No.: PCT/JP2013/064068
§ 371 (c)(1),
(2) Date: Nov. 19, 2014

(87) PCT Pub. No.: WO2013/176122
PCT Pub. Date: Nov. 28, 2013

(65) Prior Publication Data
US 2015/0123027 A1 May 7, 2015

(30) Foreign Application Priority Data
May 25, 2012 (JP) ................. 2012-120037

(51) Int. Cl.
| | | |
|---|---|---|
| C09G 1/02 | (2006.01) | |
| H01L 21/306 | (2006.01) | |
| B24B 37/04 | (2012.01) | |
| H01L 21/02 | (2006.01) | |
| B24B 37/00 | (2012.01) | |
| C09K 3/14 | (2006.01) | |
| H01L 21/304 | (2006.01) | |

(52) U.S. Cl.
CPC . *C09G 1/02* (2013.01); *B24B 37/00* (2013.01); *B24B 37/044* (2013.01); *C09K 3/14* (2013.01); *H01L 21/02024* (2013.01); *H01L 21/304* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 7,052,373 B1 * | 5/2006 | Yang et al. | 451/41 |
| 2004/0123527 A1 | 7/2004 | Kitayama et al. | |
| 2006/0162260 A1 * | 7/2006 | Nho et al. | 51/298 |
| 2006/0234509 A1 * | 10/2006 | Small et al. | 438/692 |
| 2008/0160881 A1 | 7/2008 | Fujii et al. | |
| 2011/0117720 A1 * | 5/2011 | Choi et al. | 438/424 |
| 2012/0000137 A1 * | 1/2012 | Choi et al. | 51/309 |
| 2012/0129346 A1 * | 5/2012 | Ryuzaki et al. | 438/693 |
| 2015/0139885 A1 * | 5/2015 | Iwano et al. | 423/335 |
| 2015/0140904 A1 * | 5/2015 | Iwano et al. | 451/41 |

FOREIGN PATENT DOCUMENTS

| | | |
|---|---|---|
| JP | H11-140427 A | 5/1999 |
| JP | 2003-041239 A | 2/2003 |
| JP | 2004-204118 A | 7/2004 |
| WO | 2010/086893 A1 | 8/2010 |

OTHER PUBLICATIONS

Aug. 20, 2013 Written Opinion issued in International Application No. PCT/JP2013/064068.
Aug. 20, 2013 Search Report issued in International Application No. PCT/JP2013/064068.

\* cited by examiner

*Primary Examiner* — Allan Olsen
(74) *Attorney, Agent, or Firm* — Oliff PLC

(57) ABSTRACT

An object is to provide a polishing liquid composition that can provide hydrophilicity to a wafer surface and effectively improve a haze in polishing of wafers for substrates in electronics industry. The present invention is a polishing liquid composition for wafers, comprising: water; silica particles; an alkaline compound; a polyvinyl alcohol; an anion-modified polyvinyl alcohol; and a surfactant, wherein the mass ratio of the anion-modified polyvinyl alcohol to the polyvinyl alcohol is 0.6 to 5.5. The anion-modified polyvinyl alcohol is preferably a polyvinyl alcohol modified with a carboxy group or a sulfonic acid group.

8 Claims, No Drawings

POLISHING LIQUID COMPOSITION FOR WAFERS

TECHNICAL FIELD

The present invention relates to a polishing liquid composition that is used in mirror polishing of a wafer surface and suitable for improving a haze.

BACKGROUND ART

A typical method for producing a wafer for a substrate in electronics industry includes 1) a slicing step of slicing a single crystal ingot to obtain a thin circle wafer, 2) a chamfering step of chamfering a circumferential part of the wafer, 3) a lapping step of planarizing the chamfered wafer, 4) an etching step of removing processing strain of the lapped wafer, 5) a polishing step of forming a mirror surface of the etched wafer and, 6) a washing step of washing the polished wafer.

The polishing step is carried out by pressing the wafer as a target to be polished against a polishing pad and relatively moving the wafer while a polishing liquid composition is supplied onto the surface of the polishing pad. The polishing step generally includes a plurality of stages of a first polishing, a second polishing, and a final polishing. The first polishing and the second polishing are carried out for the purpose of removing deep scratches on the wafer surface generated in the lapping step and the etching step.

On the other hand, the final polishing is carried out for the purpose of removing fine surface defects remaining after the first polishing and the second polishing and planarizing the surface in high accuracy. As evaluation criteria of the quality of the wafer after the final polishing, a light point defect (LPD) and a haze (a degree of surface clouding) are generally used.

A LPD means fine surface defects that cause diffuse reflection when a wafer having a mirror surface is irradiated with strong light. The fine surface defects result from scratches caused by coarse abrasive grains or foreign substances during polishing, attached substances such as abrasive grains or foreign substances, or a deteriorated processed layer caused by attachment of abrasive grains, foreign substances, or the like.

On the other hand, the haze means a degree of clouding generated by diffuse reflection that is caused by sub-nano level roughness of the wafer surface when a wafer having a mirror surface is irradiated with strong light. As the flatness of the wafer increases, the haze becomes better. It can be said that the smaller the number of LPDs and a value of the haze are, the better the quality of the wafer is.

In the final polishing process carried out for the purpose of improving the LPD and the haze, a polishing liquid composition is generally used in which an alkaline compound is added and then a water-soluble polymer compound is added to silica particles dispersed in water. The water-soluble polymer compound having a stress relaxation function is effective not only in reducing damage caused by abrasive grains or foreign substances but also in providing the hydrophilicity to the wafer surface and preventing attachment of abrasive grains or foreign substances. By adding a compound having an alcoholic hydroxy group, which improves the hydrophilicity of the wafer surface, the effects of reducing scratches and preventing the attachment are more improved and thus highly accurate planarization can be achieved.

Cellulose derivatives, as represented by hydroxyethyl cellulose, which have been conventionally used as water-soluble polymers, tend to cause fluctuation of quality because the cellulose derivatives are made of natural cellulose as a raw material. As a result, the LPD is often worsened by the use of the cellulose derivatives. On the other hand, although synthetic water-soluble polymers as represented by a polyvinyl alcohol have no fluctuation of quality, improvement of the haze is required.

Patent Document 1 describes a final polishing composition containing an ethylene oxide-modified polyvinyl alcohol. However, the haze is confirmed by visual observation and thus a degree of improvement is uncertain. Patent Document 2 describes a polishing composition containing an anion-modified polyvinyl alcohol. However, improvement of the haze is not described clearly.

PRIOR ART DOCUMENTS

Patent Documents

Patent Document 1: Japanese Patent Application Publication No. H11-140427 (JP H11-140427 A)
Patent Document 2: Japanese Patent Application Publication No. 2003-41239 (JP 2003-41239 A)

SUMMARY OF THE INVENTION

Problem to be Solved by the Invention

An object of the present invention is to provide a polishing liquid composition that can provide the hydrophilicity to a wafer surface and effectively improve a haze at the time of wafer polishing.

Means for Solving the Problem

In the polishing liquid composition for wafers of the present invention, as a first aspect, a polishing liquid composition for wafers, comprising: water; silica particles; an alkaline compound; a polyvinyl alcohol; an anion-modified polyvinyl alcohol; and a surfactant, in which the mass ratio of the anion-modified polyvinyl alcohol to the polyvinyl alcohol is 0.6 to 5.5;

as a second aspect, the polishing liquid composition for wafers according to the first aspect, in which the anion-modified polyvinyl alcohol is a polyvinyl alcohol modified with a carboxy group or a sulfonic acid group;

as a third aspect, the polishing liquid composition for wafers according to the first aspect or the second aspect, in which the alkaline compound is at least one selected from the group consisting of an alkaline metal hydroxide, ammonium hydroxide, an organic amine, and a quaternary ammonium hydroxide; and as a fourth aspect, the polishing liquid composition for wafers according to any one of the first aspect to the third aspect, in which the surfactant is at least one selected from the group consisting of a polyethylene glycol, an acetylene glycol, and a polyoxyethylene-polyoxypropylene copolymer.

Effects of the Invention

Use of the polishing liquid composition for wafers of the present invention in the final polishing of a wafer can provide the hydrophilicity to the wafer surface and effectively improve the haze of the wafer.

MODES FOR CARRYING OUT THE INVENTION

The polishing liquid composition for wafers of the present invention includes water, silica particles, an alkaline compound, a polyvinyl alcohol, an anion-modified polyvinyl alcohol, and a surfactant. The anion-modified polyvinyl alcohol is a polyvinyl alcohol in which a part of hydroxy groups of monomers configuring the polyvinyl alcohol is substituted with functional groups having an anionic property to improve solubility and dispersibility to water. By adding the anion-modified polyvinyl alcohol, the silica particles are more uniformly brought into contact with the wafer surface during polishing and thus the flatness of the wafer can increase, which improves the haze.

The mass ratio of the anion-modified polyvinyl alcohol to the polyvinyl alcohol is in a ratio of 0.6 to 5.5 based on the mass of a polyvinyl alcohol. The mass ratio of less than 0.6 deteriorates the haze of the wafer surface, whereas the mass ratio of 5.5 or more results in insufficient hydrophilicity of the wafer after polishing.

The silica particles used in the present invention is colloidal silica having an average primary particle diameter determined by a nitrogen adsorption method of 5 nm to 100 nm. The average primary particle diameter of less than 5 nm results in low polishing speed and results in low stability of the polishing liquid composition because aggregation of the silica particles is prone to occur. The average primary particle diameter of more than 100 nm easily generates scratches on the wafer surface and worsens the flatness of the polished surface. In the present invention, the average primary particle diameter of the silica particles is preferably in a range of 10 nm to 70 nm and more preferably in a range of 20 nm to 50 nm in order to effectively improve the haze. As the silica particles, silica particles produced by using an alkaline aqueous solution of silicic acid or an alkyl silicate as a raw material are suitable.

When coarse particles having a size of 0.5 µm or more are included in a silica sol in which the silica particles are dispersed, it is preferable that these coarse particles be removed. Examples of removal of the coarse particles may include forced precipitation and microfiltration. Examples of filters used in the microfiltration may include a depth filter, a pleated filter, a membrane filter, and a hollow fiber filter. Any of these filters can be used. Examples of materials for the filter may include cotton, polypropylene, polystyrene, polysulfone, polyethersulfone, nylon, cellulose, and glass. Any of these materials can be used. The filtration accuracy of the filter is represented by the absolute filtration accuracy (the size of particles captured 99.9% or more). The silica particles are preferably processed with a filter having an absolute filtration accuracy of 0.5 µm to 1.0 µm from the viewpoint of production efficiency (processing time, clogging of the filter, and the like).

The content of the silica particles is 0.05% by mass to 50% by mass, preferably 0.1% by mass to 20% by mass, and further preferably 5% by mass to 10% by mass to a total mass of the polishing liquid composition for wafers. The content of less than 0.05% by mass results in insufficient polishing performance, whereas the content of more than 50% by mass worsens the stability of the polishing liquid composition.

Examples of the alkaline compound used in the present invention may include an inorganic salt of an alkaline metal such as an alkaline metal hydroxide, an ammonium salt, a quaternary ammonium salt, or an organic amine.

Examples of the inorganic salt of the alkaline metal may include lithium hydroxide, sodium hydroxide, potassium hydroxide, lithium carbonate, sodium carbonate, potassium carbonate, lithium hydrogen carbonate, sodium hydrogen carbonate, and potassium hydrogen carbonate. Sodium hydroxide, potassium hydroxide, sodium carbonate, and potassium carbonate are particularly preferable.

Examples of the ammonium salt may include ammonium hydroxide, ammonium carbonate, and ammonium hydrogen carbonate. Examples of the quaternary ammonium salt may include tetramethylammonium hydroxide, tetraethylammonium hydroxide, tetramethylammonium chloride, and tetraethylammonium chloride. Among them, ammonium hydroxide is preferable.

Examples of the organic amine may include methylamine, dimethylamine, trimethylamine, ethylamine, diethylamine, triethylamine, monoethanolamine, diethanolamine, triethanolamine, N-methylethanolamine, N-methyl-N,N-diethanolamine, N,N-dimethylethanolamine, N,N-diethylethanolamine, N,N-dibutylethanolamine, ethylenediamine, hexaethylenediamine, ethylethylenediamine, piperazine hexahydrate, anhydrous piperazine, N-methylpiperazine, hydroxyethylpiperazine, N-aminoethylpiperazine, 1,3-propanediamine, N,N-dimethylethylenediamine, diethylenetriamine, monoisopropanolamine, diisopropanolamine, and triisopropanolamine. Among them, monoethanolamine, ethylenediamine, or piperazine is preferable.

Although a preferable content of the alkaline compound varies depending on an alkaline compound to be used, the content is 0.01% by mass to 30% by mass to the total mass of the polishing liquid composition for wafers of the present invention. When the alkaline compound is the inorganic salt of the alkaline metal, the content is preferably 0.01% by mass to 1.0% by mass. When the alkaline compound is the ammonium salt, the content is preferably 0.01% by mass to 5.0% by mass. When the alkaline compound is the organic amine, the content is preferably 0.01% by mass to 1.0% by mass. The behavior as the processing promoter is insufficient when the content of the alkaline compound is less than 0.01% by mass, whereas further improvement of the polishing performance cannot be expected when the content of the alkaline compound is more than 30% by mass. Among the alkaline compounds, two or more of the alkaline compounds can be used in combination.

The weight average molecular weight of a polyvinyl alcohol used in the present invention is measured by gel permeation chromatography (GPC) and is 100,000 to 500,000 and preferably 150,000 to 300,000 as a weight average molecular weight (Mw) in terms of polyethylene oxide.

The degree of saponification of the polyvinyl alcohol is preferably 70 or more and more preferably 85 or more. The degree of saponification of the polyvinyl alcohol of less than 70 is not preferable because the hydrophobicity of the polyvinyl alcohol is high and bubbling is significant.

The anion-modified polyvinyl alcohol used in the present invention is preferably a polyvinyl alcohol modified with a carboxy group or a sulfonic acid group. The amount of anion modification of the anion-modified polyvinyl alcohol is defined as the number of moles of a monomer having an anion-modified group to the number of moles of total monomers constituting the anion-modified polyvinyl alcohol. The amount of anion modification is preferably 0.1% by mole or more and preferably 10% by mole or less. The amount of anion modification is more preferably 1.0% by mole or more and 4.0% by mole or less. The amount of anion modification of less than 0.1% by mole deteriorates dispersibility of the anion-modified polyvinyl alcohol, whereas the amount of anion modification of more than 10% by mole deteriorates polymerization stability of the anion-modified polyvinyl alcohol and thus reduces the viscosity and the molecular weight of the anion-modified polyvinyl alcohol.

The weight average molecular weight (Mw) of the anion-modified polyvinyl alcohol is measured by GPC and is 10,000 to 300,000 and preferably 15,000 to 200,000 as a weight average molecular weight in terms of polyethylene oxide.

The degree of saponification of the anion-modified polyvinyl alcohol is preferably 70 or more and more preferably 90 or more. The degree of saponification of the anion-modified polyvinyl alcohol of less than 70 is not preferable because the hydrophobicity of the anion-modified polyvinyl alcohol increases and the hydrophilicity of the wafer after polishing decreases.

The mass ratio of the anion-modified polyvinyl alcohol to the polyvinyl alcohol is in a ratio of 0.6 to 5.5 based on the mass of a polyvinyl alcohol. The total content of the polyvinyl alcohol and the anion-modified polyvinyl alcohol is preferably 0.01% by mass to 2.0% by mass to the total mass of the polishing liquid composition for wafers. Less than 0.01% by mass of the total content results in insufficient hydrophilicity of the wafer surface after polishing. In contrast, more than 2.0% by mass of the total content deteriorates polishing speed and, as a result, production efficiency decreases.

When undissolved substances remain in the polyvinyl alcohol or the anion-modified polyvinyl alcohol, as foreign substances, microfiltration is suitable for removing the undissolved substances.

The polyvinyl alcohol and the anion-modified polyvinyl alcohol are synthetic water-soluble polymers and thus have less foreign substances compared with cellulose derivatives or the like. As a result, a filter having more excellent filtration accuracy can be used. Examples of filters used in the microfiltration may include a depth filter, a pleated filter, a membrane filter, and a hollow fiber filter. Any of these filters can be used. Examples of materials for the filter may include cotton, polypropylene, polystyrene, polysulfone, polyethersulfone, nylon, cellulose, and glass. Any of these materials can be used. The filtration accuracy of the filter is represented by the absolute filtration accuracy (the size of particles captured 99.9% or more). The polyvinyl alcohol and the anion-modified polyvinyl alcohol are processed with a filter having an absolute filtration accuracy of preferably 1.0 µm or less, more preferably 0.5 µm or less, and most preferably 0.2 µm or less from the viewpoint of production efficiency (processing time, clogging of the filter, and the like).

The surfactant used in the present invention is at least one compound selected from the group consisting of a polyethylene glycol, an acetylene glycol, and a polyoxyethylene-polyoxypropylene copolymer.

The content of the surfactant is 0.005% by mass to 0.5% by mass to the total mass of the polishing liquid composition for wafers. The content of the surfactant of less than 0.005% by mass shows no effect on the improvement of the haze. The content of the surfactant of more than 0.5% by mass significantly reduces the hydrophilicity. In order to further reduce the haze of the wafer surface, the content of the surfactant is preferably 0.01% by mass to 0.4% by mass and more preferably 0.01% by mass to 0.2% by mass to the total mass of the polishing liquid composition for wafers.

Examples of the wafer to which the polishing liquid composition for wafers of the present invention can be applied may include a silicon wafer, a SiC wafer, a GaN wafer, a GaAs wafer, a GaP wafer, a glass wafer, and an aluminum wafer.

The polishing device for polishing the wafer include a single surface polishing device and a double surface polishing device and the polishing liquid composition for wafers of the present invention can be used in any of the devices.

When coarse particles having a size of 0.5 µm or more are included in the polishing liquid composition for wafers of the present invention, it is preferable that these coarse particles be removed before the composition is used for polishing. Microfiltration is suitable for the removal of the coarse particles. Examples of filters used in the microfiltration may include a depth filter, a pleated filter, a membrane filter, and a hollow fiber filter. Any of these filters can be used. Examples of materials for the filter may include cotton, polypropylene, polystyrene, polysulfone, polyether sulfone, nylon, cellulose, and glass. Any of these materials can be used. The filtration accuracy of the filter is represented by the absolute filtration accuracy (the size of particles captured 99.9% or more). The polishing liquid composition for wafers of the present invention is processed with a filter having an absolute filtration accuracy of preferably 1.0 µm or less, more preferably 0.5 µm or less, and most preferably 0.2 µm or less from the viewpoint of production efficiency (processing time, clogging of the filter, and the like).

EXAMPLES

[Analysis Methods and Test Methods]

The molecular weights of water-soluble polymer compounds were measured according to the following analysis method unless otherwise noted. Table 1 lists the result.

[1] Molecular Weight Measurement of Water-Soluble Polymer Compound

The weight average molecular weights were measured by a gel permeation chromatography method under the following conditions.

Column: OHpak SB-806M HQ (8.0 mm ID×300 mm)
Column temperature: 40° C.
Eluent: 0.1 M sodium nitrate aqueous solution
Sample concentration: 0.11% by mass
Flow rate: 0.5 mL/min
Injection volume: 200 µL
Detector: RI (differential refractometer)

[2] Evaluation Method for Polishing Properties to Wafers

A polishing liquid composition for wafers that had been processed by filtration with a filter having an absolute filtration accuracy of 1.0 µm was diluted to 0.23% by mass of a silica concentration. A primary and secondary polished commercially available silicon wafer was finally polished in the following conditions.

Polishing machine: 900 φ single surface processing machine
Load: 120 g/cm$^2$
Machine platen rotation speed: 40 rpm
Head rotation speed: 40 rpm
Pad temperature: 25° C. to 26° C. before polishing and 32° C. to 36° C. after polishing
Feed rate of diluted polishing liquid composition: 350 ml/min
Polishing time: 5 minutes
Wafer: silicon wafer P$^-$ (100) face 1) Evaluation of Hydrophilicity A wet region on a wafer surface just after completion of the final polishing was visually evaluated and converted into a numeral form as a wet area. (◯) indicates that 50% or more of the total wafer surface is wet, and (x) indicates that less than 50% of the total wafer surface is wet.

2) Evaluation of Haze

After the evaluation of the hydrophilicity was completed, and the silicon wafers were washed with water, the known SC1 washing (immersion treatment in a washing liquid (SC1 liquid) having a mixed ratio of ammonia:hydrogen peroxide water=1:1 to 2:5 to 7 for 10 minutes to 20 minutes at 75° C. to 85° C.) and SC2 washing (immersion treatment in a washing liquid (SC2 liquid) having a mixed ratio of hydrochloric acid:hydrogen peroxide water=1:1 to 2:5 to 7 for 10 minutes to 20 minutes at 75° C. to 85° C.) were applied onto the wafers to remove impurities on the wafer surface. The haze of the wafer surface was measured by Surf Scan 6220 manufactured by KLA-Tencor Corporation. As the haze in Table 1, (○) indicates a haze of less than 0.110 ppm per wafer and (x) indicates a haze of 0.110 ppm or more per wafer.

Example 1

A 0.75% by mass aqueous solution of a carboxy group-modified polyvinyl alcohol having a weight average molecular weight of 140,000 (an amount of carboxy group modification of 2.0% by mole and a degree of saponification of 96.3) and a 0.25% by mass aqueous solution of a polyvinyl alcohol having a weight average molecular weight of 200,000 (a degree of saponification of 87.5) were mixed to prepare a 0.50% by mass PVA aqueous solution so that the mass ratio of the carboxy group-modified polyvinyl alcohol to the polyvinyl alcohol was 3.0. This solution was defined as a PVA mixed liquid (A). To 333.0 g of aqueous silica sol having dispersed colloidal silica with an average primary particle diameter determined by a nitrogen adsorption method of 35 nm, a silica concentration of 30% by mass, and a pH of 7.4, 345.5 g of water, 20.5 g of 28% by mass aqueous ammonia, and 550.0 g of the PVA mixed liquid (A) were added and 1.25 g of a 50% by mass aqueous solution of a polyethylene glycol having a number average molecular weight of 1,000 was further added to prepare a polishing liquid composition containing 8.0% by mass of silica concentration, 0.46% by mass of ammonia, 0.17% by mass of the carboxy group-modified polyvinyl alcohol, 0.055% by mass of the polyvinyl alcohol, and 0.05% by mass of the polyethylene glycol. The obtained polishing liquid composition had a pH of 10.6 and an Ostwald's viscosity at 25° C. of 2.0 mPa·s.

Example 2

A 0.50% by mass aqueous solution of a carboxy group-modified polyvinyl alcohol having a weight average molecular weight of 140,000 (an amount of carboxy group modification of 2.0% by mole and a degree of saponification of 96.3) and a 0.50% by mass aqueous solution of a polyvinyl alcohol having a weight average molecular weight of 200,000 (a degree of saponification of 87.5) were mixed to prepare a 0.50% by mass PVA aqueous solution so that the mass ratio of the carboxy group-modified polyvinyl alcohol to the polyvinyl alcohol was 1.0. This solution was defined as a PVA mixed liquid (B). A polishing liquid composition containing 8.0% by mass of silica concentration, 0.46% by mass of ammonia, 0.11% by mass of the carboxy group-modified polyvinyl alcohol, 0.11% by mass of the polyvinyl alcohol, and 0.05% by mass of the polyethylene glycol was prepared in the same manner as in the case of Example 1 except that the PVA mixed liquid (B) was used. The obtained polishing liquid composition had a pH of 10.6 and an Ostwald's viscosity at 25° C. of 2.0 mPa·s.

Example 3

A 0.75% by mass aqueous solution of a sulfonic acid group-modified polyvinyl alcohol having a weight average molecular weight of 20,000 (an amount of sulfonic acid group modification of 2.0% by mole and a degree of saponification of 87.1) and a 0.25% by mass aqueous solution of a polyvinyl alcohol having a weight average molecular weight of 200,000 (a degree of saponification of 87.5) were mixed to prepare a 0.5% by mass PVA aqueous solution so that the mass ratio of the sulfonic acid group-modified polyvinyl alcohol to the polyvinyl alcohol was 3.0. This solution was defined as a PVA mixed liquid (C). To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 550.0 g of the PVA mixed liquid (C) were added. Thereto, 5.0 g of a 50% by mass aqueous solution of a polyethylene glycol having a number average molecular weight of 1,000 was further added to prepare a polishing liquid composition containing 8.0% by mass of silica concentration, 0.46% by mass of ammonia, 0.17% by mass of the sulfonic acid group-modified polyvinyl alcohol, 0.055% by mass of the polyvinyl alcohol, and 0.2% by mass of the polyethylene glycol. The obtained polishing liquid composition had a pH of 10.6 and an Ostwald's viscosity at 25° C. of 2.0 mPa·s.

Example 4

To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 275.0 g of the PVA mixed liquid (A) were added. Thereto, 1.25 g of a 50% by mass aqueous solution of a polyethylene glycol having a number average molecular weight of 1,000 was added to prepare a polishing liquid composition containing 8.0% by mass of silica concentration, 0.46% by mass of ammonia, 0.083% by mass of the carboxy group-modified polyvinyl alcohol, 0.028% by mass of the polyvinyl alcohol, and 0.05% by mass of the polyethylene glycol. The obtained polishing liquid composition had a pH of 10.6 and an Ostwald's viscosity at 25° C. of 2.0 mPa·s.

Example 5

A polishing liquid composition containing 8.0% by mass of silica concentration, 0.46% by mass of ammonia, 0.055% by mass of the carboxy group-modified polyvinyl alcohol, 0.055% by mass of the polyvinyl alcohol, and 0.05% by mass of the polyethylene glycol was prepared in the same manner as in the case of Example 4 except that the PVA mixed liquid (B) was used. The obtained polishing liquid composition had a pH of 10.6 and an Ostwald's viscosity at 25° C. of 2.0 mPa·s.

Example 6

A 0.50% by mass aqueous solution of a carboxy group-modified polyvinyl alcohol having a weight average molecular weight of 140,000 (an amount of carboxy group modification of 2.0% by mole and a degree of saponification of 96.3) and a 0.50% by mass aqueous solution of a polyvinyl alcohol having a weight average molecular weight of 100,000 (a degree of saponification of 87.5) were mixed to prepare a 0.5% by mass PVA aqueous solution so that the mass ratio of the carboxy group-modified polyvinyl alcohol to the polyvinyl alcohol was 1.0. This solution was defined as a PVA mixed liquid (D). To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 275.0 g of the PVA mixed liquid (D) were added. Thereto, 1.25 g of a 50% by mass aqueous solution of a polyethylene glycol having a number average molecular weight of 1,000 was added to prepare a polishing liquid composition containing 8.0% by mass of silica concentration, 0.46% by mass of ammonia, 0.055% by mass of the carboxy group-modified polyvinyl alcohol, 0.055% by mass of the polyvinyl alcohol, and 0.05% by mass of the polyethylene glycol. The obtained polishing liquid composition had a pH of 10.6 and an Ostwald's viscosity at 25° C. of 2.0 mPa·s.

Example 7

To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 550.0 g of the PVA mixed liquid (A) were added. Thereto, 2.50 g of a 50% by mass aqueous solution of a polyethylene glycol having a number average molecular weight of 1,000 was added to prepare a polishing liquid composition containing 8.0% by mass of silica concentration, 0.46% by mass of ammonia, 0.17% by mass of the carboxy group-modified polyvinyl alcohol, 0.055% by mass of the polyvinyl alcohol, and 0.1% by mass of the polyethylene glycol. The obtained polishing liquid composition had a pH of 10.6 and an Ostwald's viscosity at 25° C. of 2.0 mPa·s.

Example 8

A polishing liquid composition containing 8.0% by mass of silica concentration, 0.46% by mass of ammonia, 0.17% by mass of the carboxy group-modified polyvinyl alcohol, 0.055% by mass of the polyvinyl alcohol, and 0.2% by mass of the polyethylene glycol was prepared in the same manner as in the case of Example 7 except that the content of the polyethylene glycol having a number average molecular weight of 1,000 was set as 0.2% by mass. The obtained polishing liquid composition had a pH of 10.6 and an Ostwald's viscosity at 25° C. of 2.0 mPa·s.

Example 9

To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 550.0 g of the PVA mixed liquid (A) were added. Thereto, 1.25 g of a 50% by mass aqueous solution of an acetylene glycol having a number average molecular weight of 700 was added to prepare a polishing liquid composition containing 8.0% by mass of silica concentration, 0.46% by mass of ammonia, 0.17% by mass of the carboxy group-modified polyvinyl alcohol, 0.055% by mass of the polyvinyl alcohol, and 0.05% by mass of the acetylene glycol. The obtained polishing liquid composition had a pH of 10.6 and an Ostwald's viscosity at 25° C. of 2.0 mPa·s.

Example 10

A polishing liquid composition containing 8.0% by mass of silica concentration, 0.46% by mass of ammonia, 0.17% by mass of the carboxy group-modified polyvinyl alcohol, 0.055% by mass of the polyvinyl alcohol, and 0.05% by mass of a polyoxyethylene-polyoxypropylene copolymer was prepared in the same manner as in the case of Example 9 except that the polyoxyethylene-polyoxypropylene copolymer having a number average molecular weight of 10,000 was used instead of the acetylene glycol as a surfactant. The obtained polishing liquid composition had a pH of 10.6 and an Ostwald's viscosity at 25° C. of 2.0 mPa·s.

Comparative Example 1

To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 550.0 g of a 0.50% by mass aqueous solution of a polyvinyl alcohol having a weight average molecular weight of 200,000 (a degree of saponification of 87.5) were added. Thereto, 1.25 g of a 50% by mass aqueous solution of a polyethylene glycol having a number average molecular weight of 1,000 was added to prepare a polishing liquid composition containing 8.0% by mass of silica concentration, 0.46% by mass of ammonia, 0.22% by mass of the polyvinyl alcohol, and 0.05% by mass of the polyethylene glycol. The obtained polishing liquid composition had a pH of 10.6 and an Ostwald's viscosity at 25° C. of 2.0 mPa·s.

Comparative Example 2

A 0.25% by mass aqueous solution of a carboxy group-modified polyvinyl alcohol having a weight average molecular weight of 140,000 (an amount of carboxy group modification of 2.0% by mole and a degree of saponification of 96.3) and a 0.75% by mass aqueous solution of a polyvinyl alcohol having a weight average molecular weight of 200,000 (a degree of saponification of 87.5) were added to water to prepare a 0.5% by mass PVA aqueous solution so that the mass ratio of the carboxy group-modified polyvinyl alcohol to the polyvinyl alcohol was 0.33. This solution was defined as a PVA mixed liquid (E). To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 550.0 g of the PVA mixed liquid (E) were added. Thereto, 1.25 g of a 50% by mass aqueous solution of a polyethylene glycol having a number average molecular weight of 1,000 was added to prepare a polishing liquid composition containing 8.0% by mass of silica concentration, 0.46% by mass of ammonia, 0.055% by mass of the carboxy group-modified polyvinyl alcohol, 0.17% by mass of the polyvinyl alcohol, and 0.05% by mass of the polyethylene glycol. The obtained polishing liquid composition had a pH of 10.6 and an Ostwald's viscosity at 25° C. of 2.0 mPa·s.

Comparative Example 3

To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 550.0 g of a 0.5% by mass aqueous solution of a carboxy group-modified polyvinyl alcohol having a weight average molecular weight of 140,000 (an amount of carboxy group modification of 2.0% by mole and a degree of saponification of 96.3) were added. Thereto, 1.25 g of a 50% by mass aqueous solution of a polyethylene glycol having a number average molecular weight of 1,000 was added to prepare a polishing liquid composition containing 8.0% by mass of silica concentration, 0.46% by mass of ammonia, 0.22% by mass of the carboxy group-modified polyvinyl alcohol, and 0.05% by mass of the polyethylene glycol. The obtained polishing liquid composition had a pH of 10.6 and an Ostwald's viscosity at 25° C. of 2.0 mPa·s.

Comparative Example 4

To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 550.0 g of a 0.50% by mass aqueous solution of an ethylene oxide group-modified polyvinyl alcohol having a weight average molecular weight of 70,000 (an amount of ethylene oxide group modification of 5.0% by mole and a degree of saponification of 99.3) were added. Thereto, 1.25 g of a 50% by mass aqueous solution of a polyethylene glycol having a number average molecular weight of 1,000 was added to prepare a polishing liquid composition containing 8.0% by mass of silica concentration, 0.46% by mass of ammonia, 0.22% by mass of the ethylene oxide group-modified polyvinyl alcohol, and 0.05% by mass of the polyethylene glycol. The obtained polishing liquid composition had a pH of 10.6 and an Ostwald's viscosity at 25° C. of 2.0 mPa·s.

Comparative Example 5

To 333.0 g of aqueous silica sol having dispersed colloidal silica with an average primary particle diameter of 35 nm, a silica concentration of 30% by mass, and a pH of 7.4, 345.5 g of water, 20.5 g of 28% by mass aqueous ammonia, and 550.0 g of the PVA mixed solution (A) were added to prepare a polishing liquid composition containing 8.0% by mass of silica concentration, 0.46% by mass of ammonia, 0.17% by mass of the carboxy group-modified polyvinyl alcohol, and 0.055% by mass of the polyvinyl alcohol. The obtained polishing liquid composition had a pH of 10.6 and an Ostwald's viscosity at 25° C. of 2.0 mPa·s.

As shown in Table 1, Examples 1 to 10 in which mass ratios of the anion-modified polyvinyl alcohol to the polyvinyl alcohol of the carboxy group-modified polyvinyl alcohol having a weight average molecular weight of 140,000 and the polyvinyl alcohol having a weight average molecular weight of 200,000 were set as 0.6 to 5.5 provided excellent evaluation results on the hazes. In contrast, Comparative Examples 1 and 2 whose mass ratios were other than the mass ratios described above, Comparative Example 4 in which the ethylene oxide-modified polyvinyl alcohol was used, and Comparative Example 5 in which no surfactant was added provided unfavorable results on the hazes. Comparative Example 3 in which the polyvinyl alcohol was not included did not provide the hydrophilicity to the wafer surface at all, Industrial Applicability The polishing liquid composition for wafers of the present invention has excellent final polishing performance and can be suitably used for reduction in the haze of the wafer surface.

The invention claimed is:
1. A polishing liquid composition for wafers, comprising:
water;
silica particles;
an alkaline compound;
a polyvinyl alcohol;

TABLE 1

| | Modified PVA (*1) | | | PVA (*2) | | Modified PVA/ PVA | Surfactant | | | Hydrophilicity | | Haze | |
|---|---|---|---|---|---|---|---|---|---|---|---|---|---|
| | Modification group | Molecular weight (×10⁴) | Content (% by mass) | Molecular weight (×10⁴) | Content (% by mass) | Mass ratio | Type | Molecular weight | Content (ppm) | Wet area (%) | Evaluation | (ppm) | Evaluation |
| Example 1 | Carboxy group | 14 | 0.17 | 20 | 0.055 | 3.0 | PEG (*3) | 1000 | 500 | 100 | ○ | 0.099 | ○ |
| Example 2 | Carboxy group | 14 | 0.11 | 20 | 0.11 | 1.0 | PEG | 1000 | 500 | 100 | ○ | 0.101 | ○ |
| Example 3 | Sulfonic acid group | 2 | 0.17 | 20 | 0.055 | 3.0 | PEG | 1000 | 2000 | 100 | ○ | 0.095 | ○ |
| Example 4 | Carboxy group | 14 | 0.083 | 20 | 0.028 | 3.0 | PEG | 1000 | 500 | 80 | ○ | 0.100 | ○ |
| Example 5 | Carboxy group | 14 | 0.055 | 20 | 0.055 | 1.0 | PEG | 1000 | 500 | 70 | ○ | 0.102 | ○ |
| Example 6 | Carboxy group | 14 | 0.055 | 10 | 0.055 | 1.0 | PEG | 1000 | 500 | 100 | ○ | 0.107 | ○ |
| Example 7 | Carboxy group | 14 | 0.17 | 20 | 0.055 | 3.0 | PEG | 1000 | 1000 | 100 | ○ | 0.096 | ○ |
| Example 8 | Carboxy group | 14 | 0.17 | 20 | 0.055 | 3.0 | PEG | 1000 | 2000 | 80 | ○ | 0.091 | ○ |
| Example 9 | Carboxy group | 14 | 0.17 | 20 | 0.055 | 3.0 | AG (*4) | 700 | 500 | 100 | ○ | 0.101 | ○ |
| Example 10 | Carboxy group | 14 | 0.17 | 20 | 0.055 | 3.0 | POEPOP (*5) | 10000 | 500 | 100 | ○ | 0.103 | ○ |
| Comparative Example 1 | — | — | 0 | 20 | 0.22 | 0.0 | PEG | 1000 | 500 | 100 | ○ | 0.115 | X |
| Comparative Example 2 | Carboxy group | 14 | 0.055 | 20 | 0.17 | 0.33 | PEG | 1000 | 500 | 100 | ○ | 0.116 | X |
| Comparative Example 3 | Carboxy group | 14 | 0.22 | — | 0 | ∞ | PEG | 1000 | 500 | 0 | X | 0.101 | ○ |
| Comparative Example 4 | Ethylene oxide group | 7 | 0.22 | — | 0 | ∞ | PEG | 1000 | 500 | 100 | ○ | 0.134 | X |
| Comparative Example 5 | Carboxy group | 14 | 0.17 | 20 | 0.055 | 3.0 | PEG | 1000 | 0 | 100 | ○ | 0.119 | X |

*1: Modified polyvinyl alcohol
*2: Polyvinyl alcohol
*3: Polyethylene glycol
*4: Acetylene glycol
*5: Polyoxyethylene-polyoxypropylene copolymer an anion-modified polyvinyl alcohol; and
a surfactant, wherein
the mass ratio of the anion-modified polyvinyl alcohol to the polyvinyl alcohol is 0.6 to 5.5.

2. The polishing liquid composition for wafers according to claim 1, wherein
the anion-modified polyvinyl alcohol is a polyvinyl alcohol modified with a carboxy group or a sulfonic acid group.

3. The polishing liquid composition for wafers according to claim 2, wherein
the surfactant is at least one selected from the group consisting of a polyethylene glycol, an acetylene glycol, and a polyoxyethylene-polyoxypropylene copolymer.

4. The polishing liquid composition for wafers according to claim 2, wherein
the alkaline compound is at least one selected from the group consisting of an alkaline metal hydroxide, ammonium hydroxide, an organic amine, and a quaternary ammonium hydroxide.

5. The polishing liquid composition for wafers according to claim 4, wherein
the surfactant is at least one selected from the group consisting of a polyethylene glycol, an acetylene glycol, and a polyoxyethylene-polyoxypropylene copolymer.

6. The polishing liquid composition for wafers according to claim 1, wherein
the alkaline compound is at least one selected from the group consisting of an alkaline metal hydroxide, ammonium hydroxide, an organic amine, and a quaternary ammonium hydroxide.

7. The polishing liquid composition for wafers according to claim 6, wherein
the surfactant is at least one selected from the group consisting of a polyethylene glycol, an acetylene glycol, and a polyoxyethylene-polyoxypropylene copolymer.

8. The polishing liquid composition for wafers according to claim 1, wherein
the surfactant is at least one selected from the group consisting of a polyethylene glycol, an acetylene glycol, and a polyoxyethylene-polyoxypropylene copolymer.

* * * * *